United States Patent
Someya (10) Patent No.: US 7,369,831 B2
(45) Date of Patent: May 6, 2008

(54) RADIO WAVE RECEIVE, RADIO WAVE RECEPTION INTEGRATED CIRCUIT, WAVE CLOCK, AND REPEATER

(75) Inventor: Kaoru Someya, Kiyose (JP)

(73) Assignee: Casio Computer Co., Ltd., Tokyo (JP)

( * ) Notice: Subject to any disclaimer, the term of this patent is extended or adjusted under 35 U.S.C. 154(b) by 500 days.

(21) Appl. No.: 11/045,466

(22) Filed: Jan. 27, 2005

(65) Prior Publication Data

US 2005/0170795 A1    Aug. 4, 2005

(30) Foreign Application Priority Data

Feb. 4, 2004   (JP)   ............................. 2004-027567

(51) Int. Cl.
    *H04B 1/10*   (2006.01)
(52) U.S. Cl. ....................... 455/271; 455/217; 455/283
(58) Field of Classification Search .................. None
    See application file for complete search history.

(56) References Cited

U.S. PATENT DOCUMENTS

| | | | |
|---|---|---|---|
| 3,694,754 A | 9/1972 | Baltzer | |
| 4,843,401 A | * 6/1989 | Bass | ........................... 343/701 |
| 5,083,123 A | 1/1992 | Ganter et al. | |
| 5,537,101 A | 7/1996 | Nakajima et al. | |
| 6,144,535 A | * 11/2000 | Ishii | .............................. 361/1 |
| 2003/0117903 A1 | 6/2003 | Nakajima et al. | |

FOREIGN PATENT DOCUMENTS

| | | |
|---|---|---|
| EP | 0 657 794 A2 | 6/1995 |
| EP | 1 316 860 A2 | 6/2003 |
| JP | 2001-274704 A | 10/2001 |
| JP | 2003-283347 A | 10/2003 |

* cited by examiner

*Primary Examiner*—Thanh Cong Le
(74) *Attorney, Agent, or Firm*—Frishauf, Holtz, Goodman & Chick, P.C.

(57) ABSTRACT

An SW control circuit turns ON and OFF a switch circuit provided between a reception antenna and an RF amplifier circuit, based on a noise removal control signal which is generated by a timing generation circuit and has a constant pulse width and a constant pulse interval, and thus the antenna is periodically short-circuited. In this way, even when the antenna receives a signal mixed with noise signals, accumulated energy due to the noise signals is periodically released, and thus the noise signals can be removed from the reception signal, and long lasting influence caused by the accumulated energy of the noise signals can be also removed.

13 Claims, 9 Drawing Sheets

RADIO WAVE RECEIVE, RADIO WAVE RECEPTION INTEGRATED CIRCUIT, WAVE CLOCK, AND REPEATER

CROSS-REFERENCE TO RELATED APPLICATIONS

This application is based upon and claims the benefit of priority from the prior Japanese Patent Application No. 2004-027567, filed on Feb. 4, 2004, and the entire contents of which are incorporated herein by reference.

BACKGROUND OF THE INVENTION

1. Field of the Invention

The present invention relates to a radio wave receiver that detects a reception signal received by an antenna and outputs a detection signal, a radio wave reception integrated circuit, a wave clock equipped with the radio wave receiver, and a repeater.

2. Description of Related Art

A standard radio wave including time data, that is, a time code, is sent in some countries (for example, Germany, England, Switzerland, Japan, etc.). In Japan, two transmitting stations, located in Fukushima and Saga prefectures, send out standard radio waves having frequencies of 40 kHz and 60 kHz, respectively. The time code included in a standard radio wave is sent out on a frame basis with a cycle of 60 seconds, for every update of a minute digit of the accurate time, that is, for every one minute.

There has been known a so-called wave clock that receives such a standard radio wave to thereby correct the current time data. An actual reception signal received by the wave clock is a signal in which the standard radio wave sent from a transmitting station is mixed (superposed) with noise signals, such as radio waves generated in external devices or inside the clock. The mixing of noise signals causes difficulty in reproducing the time code included in the standard radio wave, and deteriorates reception sensitivity. In order to avoid this, there have been proposed various methods for removing the noise signals mixed in the reception signal.

It is generally known, for example, to use a filter to remove noises when the received radio wave is detected. However, a filter has a certain pass band, and thus also allows passage of noise components in the vicinity of the frequency of the radio wave that is expected to pass therethrough. Further, the narrower the pass band of a filter is, the more likely a delay time is generated, which causes adverse effect on the signal processing performed thereafter. It is also known to shield a digital circuit acting as a noise source. There is also known a method in which the operation of a display circuit generating noise is suspended when the standard radio wave is received.

Generally, noise signal energy accumulated in an antenna produces a bad influence not only on a wave clock that receives a standard radio wave, but also on radio wave receivers that receive radio waves. For example, when an antenna receives a pulse-shaped noise signal, a part of the noise signal energy is accumulated in the antenna. This energy produces a signal (attenuation signal) which has the same frequency as a tuning frequency of the antenna, and is attenuated in a fairly long term relative to a generation time of the pulse acting as the noise. The larger amount of noise, that is, the larger accumulated energy makes the damping time of the damping signal longer.

Accordingly, when the antenna receives a signal mixed with a noise signal, waveform deterioration occurs due to the mixing of the noise signal, and additionally, the antenna outputs a composite signal mixed with an attenuation signal caused by the noise signal energy accumulated in the antenna (accumulated energy), that is, a signal having long lasting influence of the noise signal.

SUMMARY OF THE INVENTION

It is therefore an object of the invention to provide a radio wave receiver, a radio wave reception integrated circuit, a wave clock and a repeater, which are capable of eliminating the long lasting influence of noise signal energy accumulated in an antenna by periodically short-circuiting the antenna to remove noise signals included in a reception signal received by the antenna.

DETAILED DESCRIPTION OF THE PREFERRED EMBODIMENTS

Best modes for carrying out the invention will be explained hereinbelow with reference to the drawings. A description will be given below of a wave clock to which the invention is applied, but it is to be understood that the invention is also applicable to other radio wave receiving apparatuses.

<Structure of Wave Clock>

Figure 1:
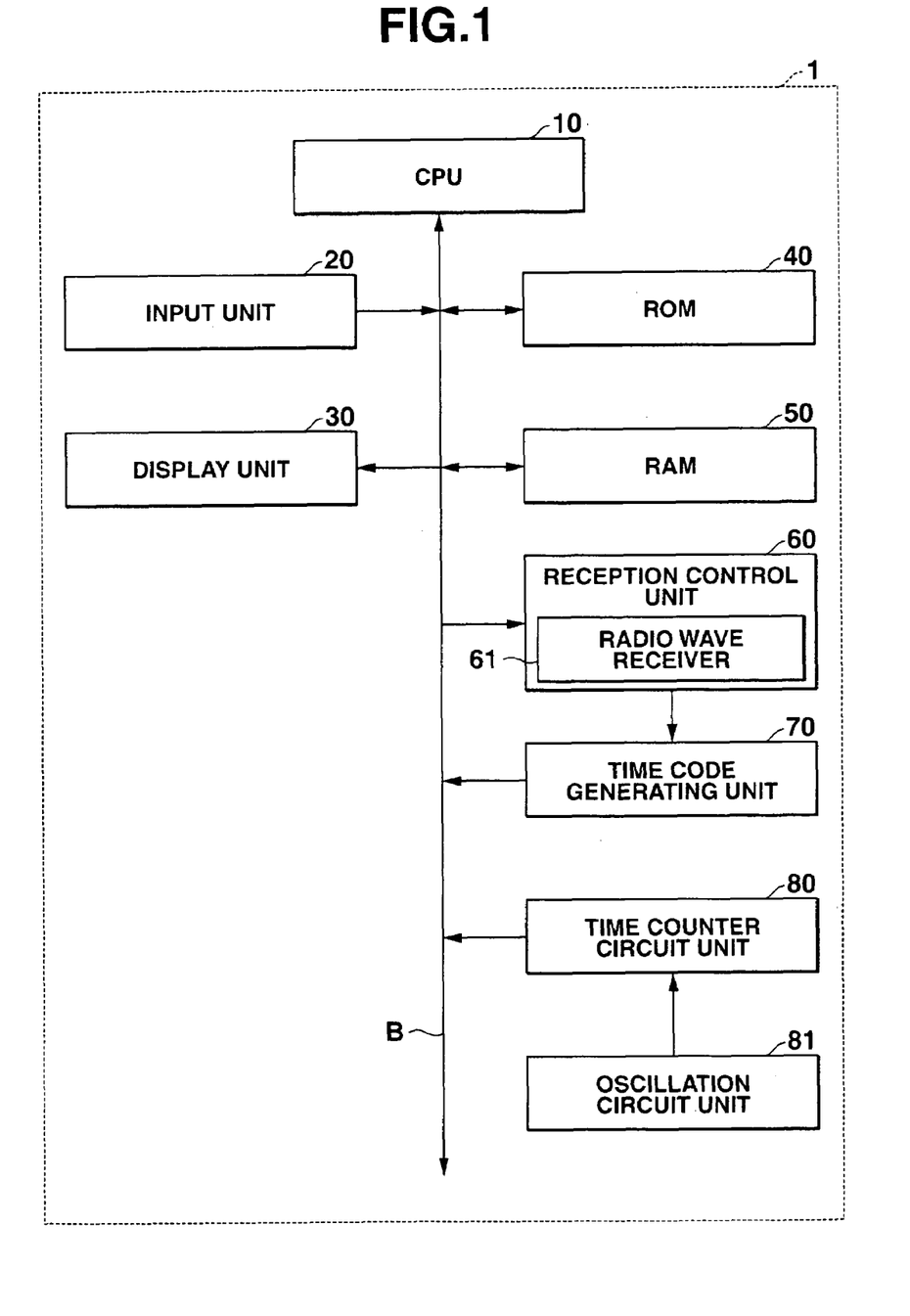
FIG. 1 is a diagram showing a circuit configuration of a wave clock to which the present invention is applied.

FIG. 1 is a block diagram showing a circuit configuration of a wave clock 1 to which the present invention is applied.

Referring to FIG. 1, the wave clock 1 includes a CPU (central processing unit) 10, an input unit 20, a display unit 30, a ROM (read only memory) 40, a RAM (random access memory) 50, a reception control unit 60, a time code generating unit 70, a time counter circuit unit 80, and an oscillation circuit unit 81. Each unit except the oscillation circuit unit 81 is connected to a bus B so as to be capable of data transmission therethrough. The oscillation circuit unit 81 is coupled to the time counter circuit unit 80. The reception control unit 60 includes a radio wave receiver 61.

The CPU 10 reads out various programs stored in the ROM 40 according to a predetermined timing or an operation signal inputted from the input unit 20 to develop them in the RAM 50, and performs instructing, data transmission and the like to each unit in the wave clock 1 based on the programs. In particular, the CPU 10 performs various controls: for example, it controls the reception control unit 60 at every predetermined time to execute reception processing of a standard radio wave, corrects the current time data counted by the time counter circuit unit 80 based on the standard time code inputted from the time code generating unit 70, and outputs a display signal to the display unit 30 based on the corrected time code to update the displayed time.

The input unit 20 includes switches and the like for allowing the wave clock 1 to perform various functions, and operation of each switch causes an operation signal corresponding to the switch to be outputted to the CPU 10. The display unit 30 has a small-sized liquid crystal display or the like, and performs, for example, digital display of such as current time data counted by the time counter circuit unit 80 based on a display signal inputted from the CPU 10.

The ROM 40 stores mainly a system program, application programs and data associated with the wave clock 1. The RAM 50 is used as a working area of the CPU 10, and temporarily stores programs and data read from the ROM 40, data processed by the CPU 10, and the like.

The reception control unit 60 includes the radio wave receiver 61. The receiver 61 cuts unnecessary frequency components from reception signals received by a reception antenna, and takes out a frequency signal corresponding to the standard radio wave. The receiver 61 then converts the taken-out frequency signal into a corresponding signal and outputs it.

The time code generating unit 70 generates a standard time code including data necessary for clock functions such as a standard clock time code, an adding-up date code, a day of the week code, etc. based on the signal inputted from the radio wave receiver 61, and outputs it to the CPU 10.

The time counter circuit unit 80 counts a signal inputted from the oscillation circuit unit 81 to count the current time data etc., and outputs the counted current time data to the CPU 10. The oscillation circuit unit 81 always outputs a signal of a constant frequency.

Two embodiments applied to the wave clock 1 constructed as described above will be explained below one by one. The wave clock 1 of the embodiments has features in the radio wave receiver 61, and therefore the radio wave receiver 61 will be explained in detail in the following embodiments.

First Embodiment

First, a first embodiment will be explained.

<Structure of Radio Wave Receiver>

Figure 2:
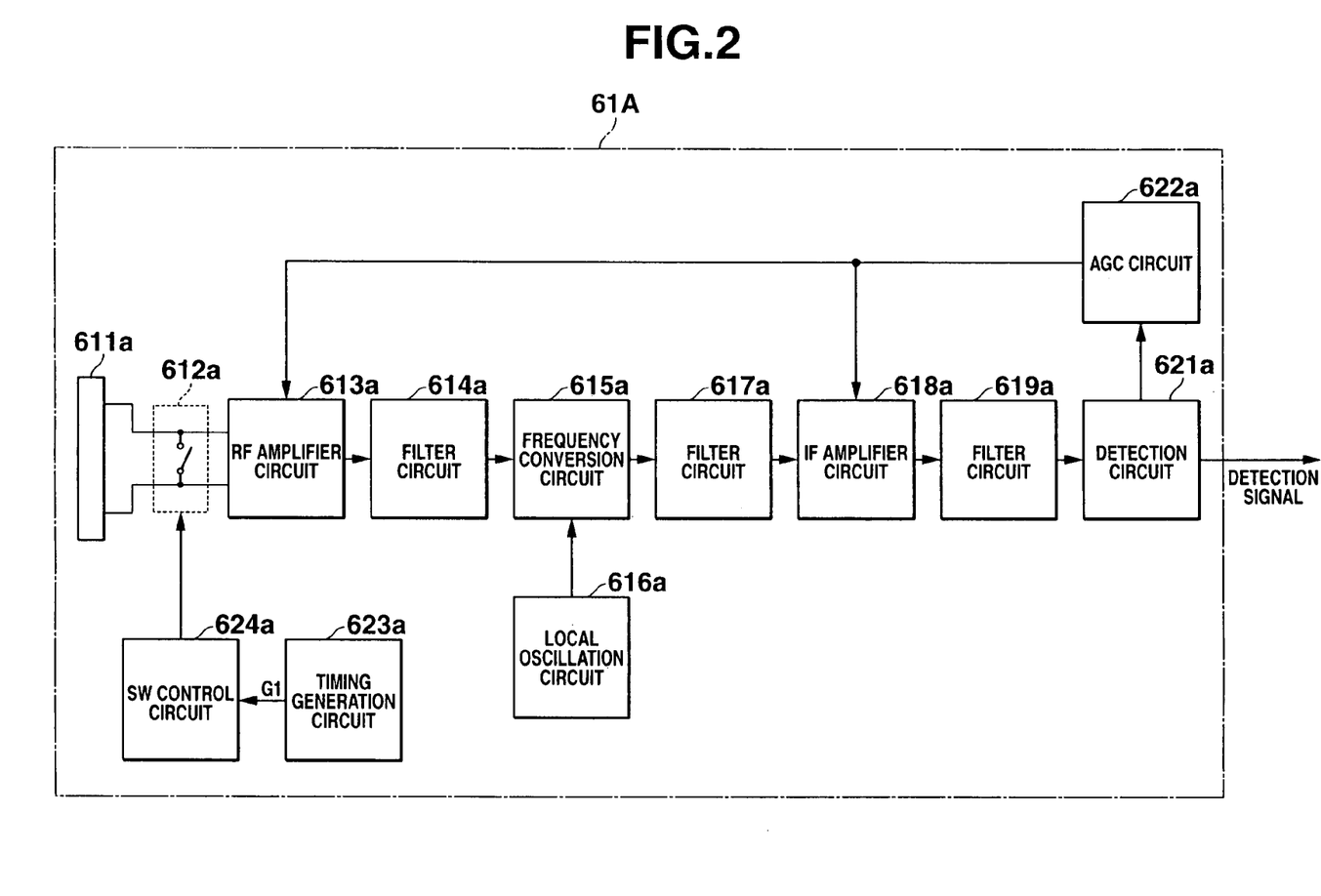
FIG. 2 is a diagram showing a circuit configuration of a radio wave receiver in a first embodiment of the invention.

FIG. 2 is a block diagram showing a circuit configuration of a radio wave receiver 61A employing the super-heterodyne system in the first embodiment. Referring to FIG. 2, the radio wave receiver 61A includes a reception antenna 611a, a switch circuit 612a, an RF amplifier circuit 613a, filter circuits 614a, 617a and 619a, a frequency conversion circuit 615a, a local oscillation circuit 616a, an IF amplifier circuit 618a, a detection circuit 621a, an AGC (auto gain control) circuit 622a, an SW control circuit 624a and a timing generation circuit 623a. Each of the configuration elements in the receiver 61A except the reception antenna 611a may be constituted using a semiconductor integrated circuit.

The reception antenna 611a is, for example, a bar antenna, and, tuning to the frequency (e.g., 40 kHz or 60 kHz in Japan) of a standard radio wave including a time code, receives it, converts it into a corresponding electric signal, and outputs it.

The switch circuit 612a is provided between the reception antenna 611a and the RF amplifier circuit 613a, and turns ON and OFF a switch according to the control by the SW control circuit 624a. While the switch circuit 612a is OFF, the signal outputted from the antenna 611a is inputted to the RF amplifier circuit 613a. In contrast, while the switch circuit 612a is ON, the signal outputted from the antenna 611a is not inputted to the RF amplifier circuit 613a, because the antenna 611a is short-circuited. Here, the switch circuit 612a may have an impedance connected in series with a switch to facilitate consumption of the accumulated energy.

The RF amplifier circuit 613a amplifies (or attenuates) the signal inputted from the antenna 611a through the switch circuit 612a by the amplification degree corresponding to an RF control signal inputted from the AGC circuit 622a, and outputs it. The filter circuit 614a is composed of a band pass filter or the like. The filter circuit 614a outputs the signal inputted from the RF amplifier circuit 613a, allowing the passage of frequency within a predetermined range having the received frequency at the center, and blocking frequency components outside the range.

The frequency conversion circuit 615a synthesizes the signal inputted from the filter circuit 614a and a signal inputted from the local oscillation circuit 616a, and outputs an intermediate frequency signal. The local oscillation circuit 616a generates a local oscillation frequency signal and outputs it. The filter circuit 617a is composed of a band pass filter or the like. The filter circuit 617a outputs the intermediate frequency signal inputted from the frequency conversion circuit 615a, allowing the passage of frequency within a predetermined range having the intermediate frequency at the center, and blocking frequency components outside the range.

The IF amplifier circuit 618a amplifies (or attenuates) the signal inputted from the filter circuit 617a by the amplification degree corresponding to an IF control signal inputted from the AGC circuit 622a, and outputs it. The filter circuit 619a is composed of a band pass filter or the like. The filter circuit 619a outputs the signal inputted from the IF amplifier circuit 618a, allowing the passage of frequency within a predetermined range, and blocking frequency components outside the range.

The detection circuit 621a detects the signal inputted from the filter circuit 619a, and outputs a detection signal. The AGC circuit 622a generates the RF control signal as a gain control signal for adjusting the amplification degree of the RF amplifier 613a according to the strength (signal level) of the detection signal inputted from the detection circuit 621a, and also generates the IF control signal as a gain control signal for adjusting the amplification degree of the IF amplifier 618a, and outputs the control signals.

Figure 3:
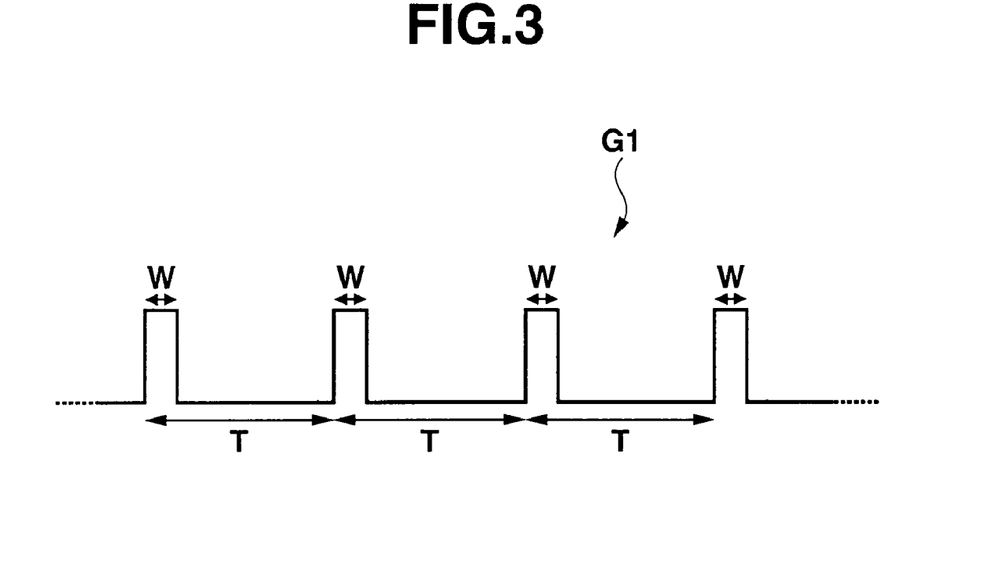
FIG. 3 is a waveform view of a noise removal control signal in the first embodiment of the invention.

The timing generation circuit 623a generates and outputs a noise removal control signal G1 for controlling noise removal from the reception signal received at the antenna 611a. The noise removal control signal G1 is, as shown in FIG. 3, a pulse signal having a constant pulse width W and a constant pulse interval T. The pulse width W is substantially shorter (very small) compared with the cycle of the second signal (i.e., 1 second) of the standard radio wave (modulated wave) to be received by the antenna 611a, and is or more than a half cycle of a carrier wave (signal of 40 kHz or 60 kHz in Japan) in length. Here, the width is assumed to cover a few cycles of the carrier wave.

The SW control circuit 624a controls ON/OFF of the switch circuit 612a according to the noise removal control signal G1 inputted from the timing generation circuit 623a. To be concrete, the switch circuit 612a is turned ON while the noise removal control signal G1, a pulse signal, is being inputted, otherwise the switch circuit is turned OFF.

Accordingly, since both the pulse width W and the pulse period T of the noise removal control signal G1 are constant, the reception antenna 611a is periodically short-circuited during the time corresponding to the width W at time intervals corresponding to the pulse period T. While the antenna 611a is short-circuited, that is, during the time corresponding to the pulse width W, the reception signal is not inputted to the RF amplifier circuit 613a. Since the pulse width W covers, for example, a few cycles of carrier wave of the reception signal, the short circuit of the antenna 611a causes most of the energy accumulated in the antenna 611a at this time to be released.

Figure 4A:
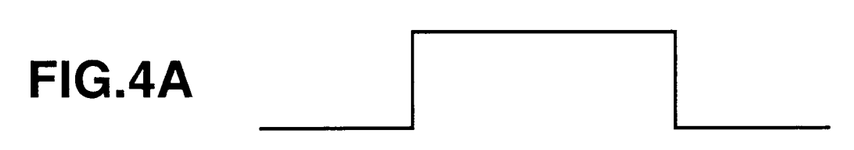
FIG. 4A is a waveform view of an ideal detection signal without mixing of a noise signal in the first embodiment of the invention.

FIGS. 4A to 4F show signal waveforms at several points in the radio wave receiver 61A. FIG. 4A shows an ideal detection signal waveform in the case where a noise signal is not mixed. When a noise signal is not mixed, the detection signal is ideally a square-wave, and the antenna 611a receives a signal having this waveform as an envelope line.

Figure 4B:
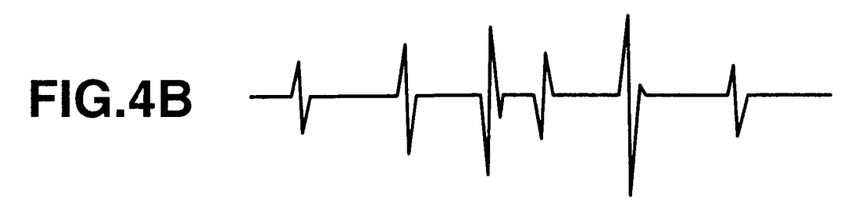
FIG. 4B is a waveform view of a noise signal to be mixed to a reception signal in the first embodiment of the invention.
Figure 4C:
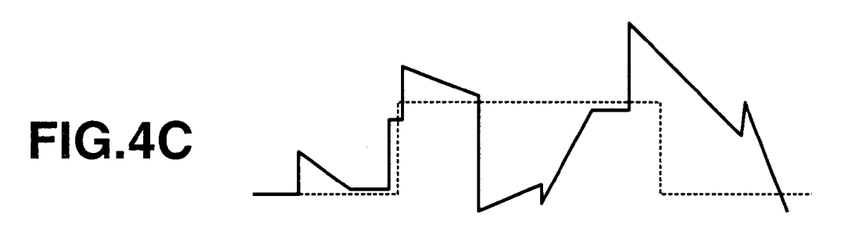
FIG. 4C is a waveform view of a detection signal obtained when a reception signal mixed with the noise signal is detected, in the first embodiment of the invention.

FIG. 4B shows a waveform of a noise signal to be mixed to the reception signal. FIG. 4C shows a waveform of a detection signal for the reception signal mixed with the noise signal shown in FIG. 4B. Here, a dotted line shows the ideal detection signal waveform without a noise signal, which is shown in FIG. 4A.

Referring to FIG. 4C, the reception signal with a noise signal causes waveform deterioration due to the mixing (superposing) of a noise signal, and further, because of noise signal energy accumulated in the antenna 611a (accumulated energy), the amplitude of the waveform largely deviates from that of the ideal detection signal waveform.

Figure 4D:
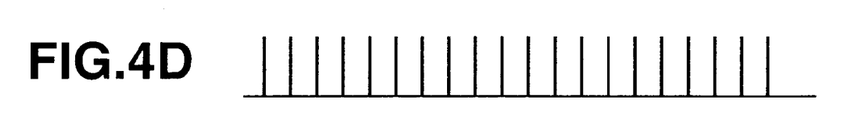
FIG. 4D is a waveform view of a noise removal control signal G1 in the first embodiment of the invention.
Figure 4E:
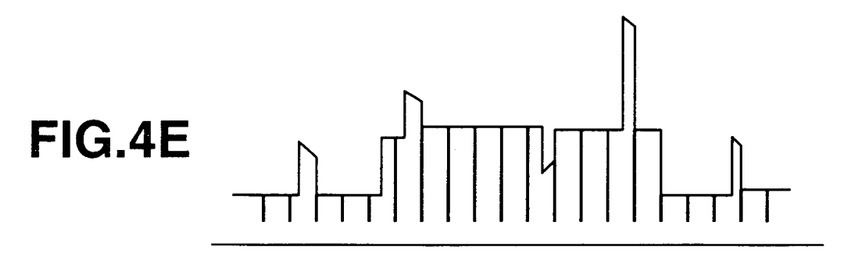
FIG. 4E is a waveform view of a detection signal obtained when noise removal is performed, in the first embodiment of the invention.

FIG. 4D shows a waveform of the noise removal control signal G1. Although the waveform of the noise removal control signal G1 is shown in FIG. 4D in an impulse shape, it is actually a pulse-shaped signal having a constant pulse width W and a constant pulse period T as shown in FIG. 3. FIG. 4E shows a detection signal waveform obtained when the noise removal control signal G1 shown in FIG. 4D is generated (i.e., when noise removal is performed).

When the noise removal control signal G1 is generated, the switch circuit 612a is turned ON while the pulse of the control signal G1 is being inputted, which causes the antenna 611a to be short-circuited. This short circuit prevents the reception signal at the antenna 611a from being transmitted to the circuits at the subsequent stages (that is, the RF amplifier circuit 613a and the following circuits), thus lowering the detection signal level to a predetermined level. Further, this short circuit of the antenna 611a causes the accumulated energy to be released, and the detection signal obtained just after the end of the pulse input has almost the same waveform as that (FIG. 4A) obtained in the case where a noise signal is not mixed. This means that the pulse input can eliminate the influence of noise signals.

Figure 4F:
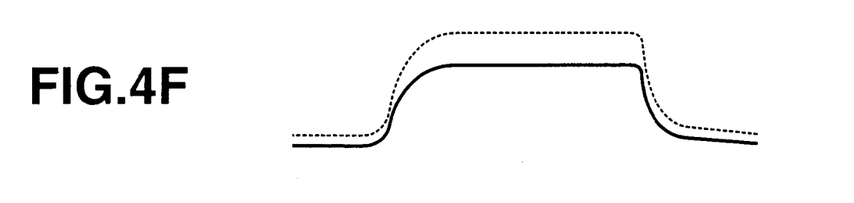
FIG. 4F is a signal waveform view showing a state after an LPF has passed through the detection signal obtained when the noise removal is performed, in the first embodiment of the invention.

FIG. 4F shows a waveform appearing after the detection signal shown in FIG. 4E passes through an LPF (low pass filter) The dotted line shows a detection signal waveform obtained in the case where a noise signal is not mixed and the noise removal is not applied. The noise removal causes the whole signal level to be lowered due to the level down of the detection signal during pulse input of the noise removal control signal G1. However, since the standard radio wave is a signal having two modulation degrees of 10% and 100%, this level down does not affect reproduction of the time code.

<Operations and Effects>

According to the first embodiment, the switch circuit 612a is turned ON and OFF according to the noise removal control signal G1 generated at the timing generation circuit 623a. The noise removal control signal G1 is a pulse signal having a constant pulse width W and a constant pulse period T. That is, the reception antenna 611a is periodically short-circuited at time intervals corresponding to the pulse period T of the control signal G1 during the term corresponding to the pulse width W. This periodic short circuit of the reception antenna 611a causes the accumulated energy to be periodically released, thereby removing noise signals from the reception signal, and allowing removal of the continuation of influence caused by the accumulated energy of the noise signals.

Second Embodiment

Next, a second embodiment will be explained.

The second embodiment differs from the first embodiment in that a noise removal control signal is generated based on a signal level of a gain control signal.

<Structure of Radio Wave Receiver>

Figure 5:
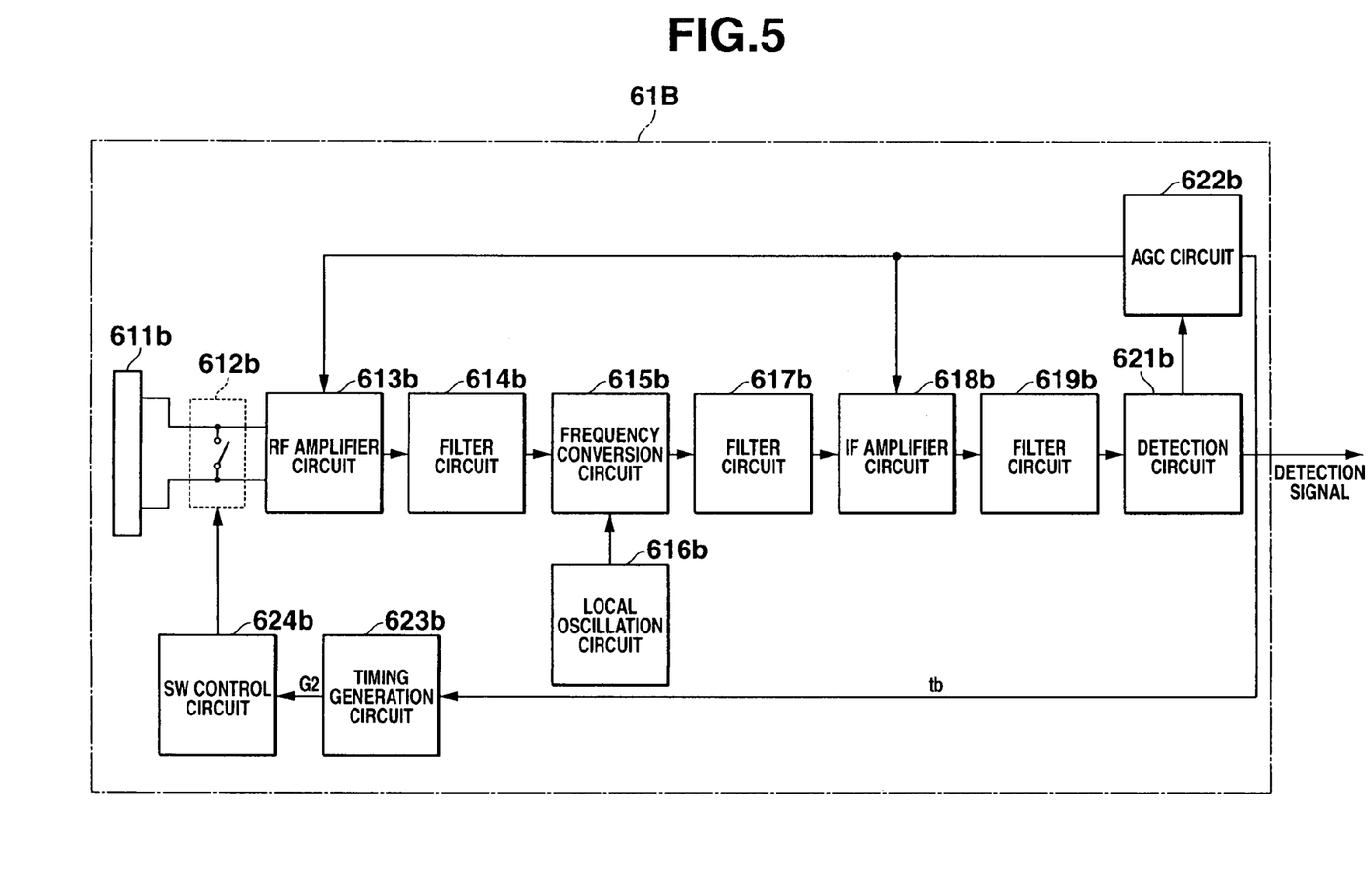
FIG. 5 is a diagram showing a circuit configuration of a radio wave receiver in a second embodiment of the invention.

FIG. 5 is a block diagram showing a circuit configuration of a radio wave receiver 61B using the super-heterodyne system in the second embodiment. Referring to FIG. 5, the radio wave receiver 61B includes a reception antenna 611b, a switch circuit 612b, an RF amplifier circuit 613b, filter circuits 614b, 617b and 619b, a frequency conversion circuit 615b, a local oscillation circuit 616b, an IF amplifier circuit 618b, a detection circuit 621b, an AGC circuit 622b, a timing generation circuit 623b and an SW control circuit 624b. Each of the configuration elements in the receiver 61B except the reception antenna 611b may be constituted using a semiconductor integrated circuit.

Here, the reception antenna 611b, RF amplifier circuit 613b, filter circuits 614b, 617b and 619b, frequency conversion circuit 615b, local oscillation circuit 616b, IF amplifier circuit 618b and detection circuit 621b correspond to the reception antenna 611a, RF amplifier circuit 613a, filter circuits 614a, 617a and 619a, frequency conversion circuit 615a, local oscillation circuit 616a, IF amplifier circuit 618a and detection circuit 621a, respectively, which are shown in FIG. 2 of the first embodiment, and the detailed description thereof is omitted.

The AGC circuit 622b generates an RF control signal for adjusting the amplification degree of the RF amplifier circuit 613b and an IF control signal for adjusting the amplification degree of the IF amplifier circuit 618b according to the strength (signal level) of the detection signal inputted from the detection circuit 621b, and also generates a timing control signal tb for controlling the generation of a noise removal control signal G2 by the timing generation circuit 623b. Here, the timing control signal tb may be the same signal as the RF control signal or the IF control signal, or may be a signal produced by properly changing (to be higher or lower) the signal level of the RF or IF control signal.

The switch circuit 612b is provided between the reception antenna 611b and the RF amplifier circuit 613b, and turns ON and OFF a switch according to the control by the SW control circuit 624b. While the switch circuit 612b is OFF, the signal outputted from the antenna 611b is inputted to the RF amplifier circuit 613b. In contrast, while the switch circuit 612b is ON, the signal outputted from the antenna 611b is not inputted to the RF amplifier circuit 613b, because the antenna 611b is short-circuited. Here, the switch circuit 612b may have an impedance connected in series with the switch to facilitate consumption of the accumulated energy.

Figure 6:
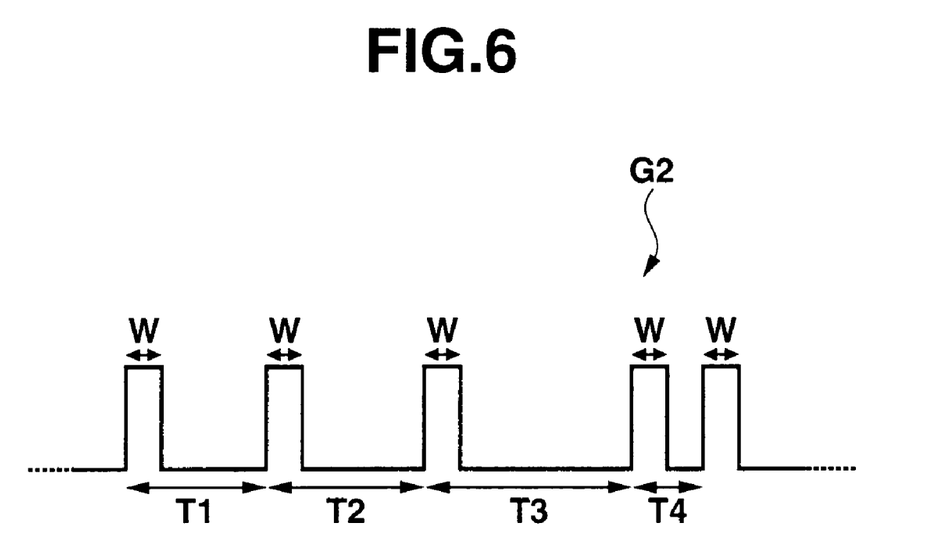
FIG. 6 is a waveform view of a noise removal control signal in the second embodiment of the invention.

The timing generation circuit 623b generates and outputs the noise removal control signal G2 for controlling noise removal from the reception signal received at the antenna 611b according to the signal level of the timing control signal tb inputted from the AGC circuit 622b. The noise removal control signal G2 is, as shown in FIG. 6, a pulse signal having a constant pulse width W. The pulse width. W is substantially shorter (very small) compared with the period of the second signal (i.e., 1 second) of the standard radio wave to be received by the antenna 611b, and is or more than a half cycle of the carrier wave in length. Here, the width is assumed to cover a few cycles of the carrier wave.

The lengths of pulse intervals T1, T2 . . . depend on the signal level of the timing control signal tb, and this signal level of the signal tb is generated according to the signal level of the detection signal, that is, affected by the noise signal size. In the case where the detection signal is processed after passing through an LPF, its signal level tends to go down as the frequency of short circuit at the antenna 611b becomes higher. Therefore, the pulse interval is set shorter as the reception sensitivity of the receiver 61B detected by the AGC circuit 622b is higher, and set longer as the reception sensitivity is lower.

The SW control circuit 624b controls ON/OFF of the switch circuit 612b according to the noise removal control signal G2 inputted from the timing generation circuit 623b. To be concrete, the switch circuit 612b is turned ON while the noise removal control signal G2, a pulse signal, is being inputted, otherwise the switch circuit is turned OFF.

Accordingly, during the time corresponding to the pulse width W of the noise removal control signal G2, the antenna 611b is short-circuited, and the reception signal is not inputted to the RF amplifier circuit 613b. Since the pulse width W covers, for example, a few cycles of the carrier wave of the reception signal received by the antenna 611b, the short circuit of the antenna 611b causes most of the energy accumulated in the antenna 611b at this time to be released.

<Operations and Effects>

According to the second embodiment, the switch circuit 612b is turned ON and OFF according to the noise removal control signal G2 generated at the timing generation circuit 623b. The noise removal control signal G2 is a pulse signal having a constant pulse width W and pulse intervals T1, T2 . . . in accordance with the signal level of the timing control signal tb. That is, the reception antenna 611b is periodically short-circuited during the time corresponding to the pulse width W at time intervals corresponding to the pulse intervals T1, T2 . . . of the noise removal control signal G2. This short circuit of the reception antenna 611b causes the accumulated energy to be released, thereby removing noise signals from the reception signal, and also allowing removal of the continuation of influence caused by the accumulated energy of the noise signals. Further, since the timing control signal tb is based on the gain control signal, resultantly, the reception antenna 611b is short-circuited at time intervals T1, T2 . . . in accordance with the signal level of the detection signal, and thus noise signals and its influence can be removed more effectively.

Third Embodiment

Next, a third embodiment will be explained.

The third embodiment differs from the first and second embodiments in that a noise removal control signal is generated according to determined mixing frequency of a noise signal.

<Structure of Radio Wave Receiver>

Figure 7:
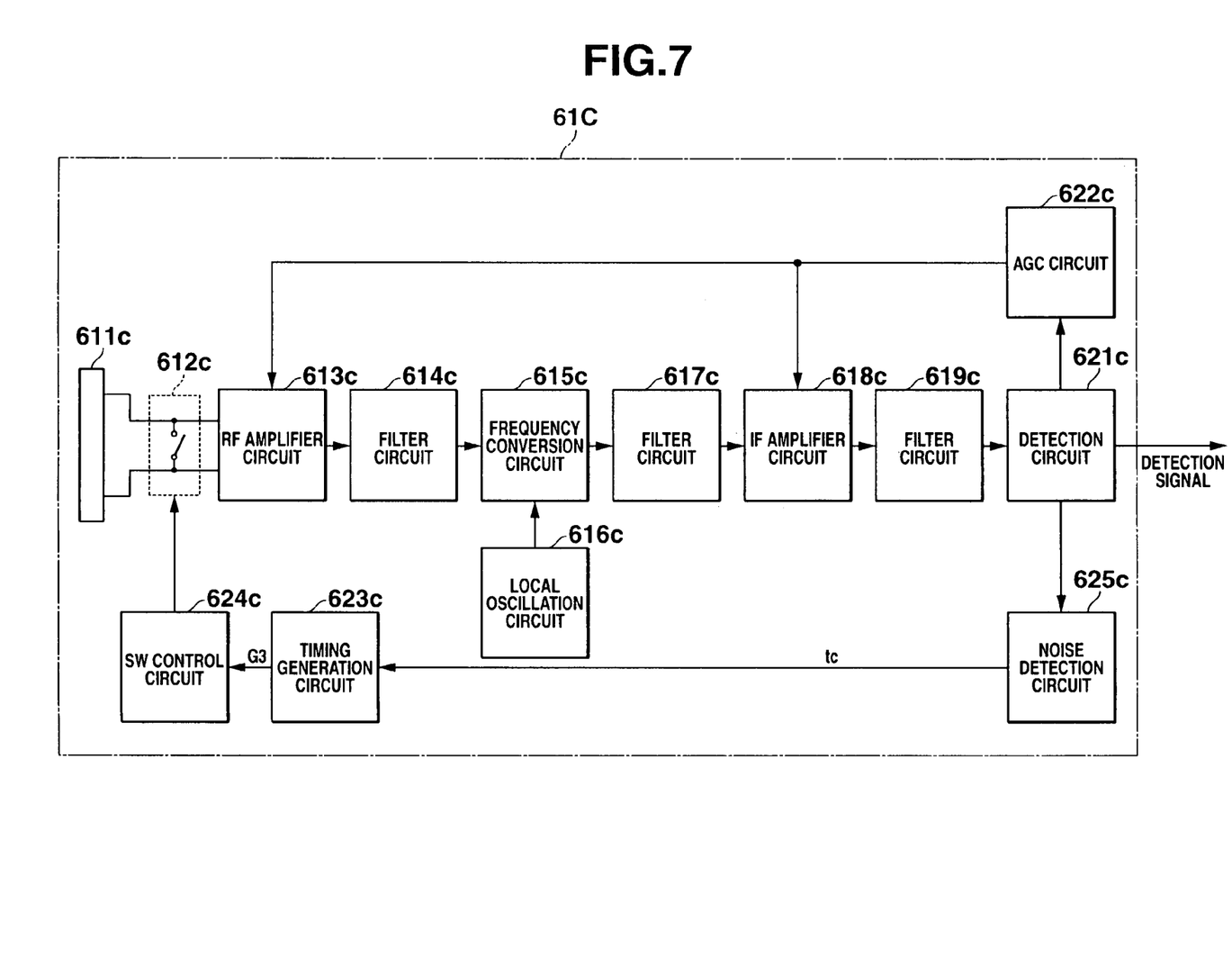
FIG. 7 is a diagram showing a circuit configuration of a radio wave receiver in a third embodiment of the invention.

FIG. 7 is a block diagram showing a circuit configuration of a radio wave receiver 61C using the super-heterodyne system in the third embodiment. Referring to FIG. 7, the radio wave receiver 61C includes a reception antenna 611c, a switch circuit 612c, an RF amplifier circuit 613c, filter circuits 614c, 617c and 619c, a frequency conversion circuit 615c, a local oscillation circuit 616c, an IF amplifier circuit 618c, a detection circuit 621c, an AGC circuit 622c, a timing generation circuit 623c, an SW control circuit 624c, and a noise detection circuit 625c. Each of the configuration elements in the receiver 61C except the reception antenna 611c may be constituted using a semiconductor integrated circuit.

Here, the reception antenna 611c, RF amplifier circuit 613c, filter circuits 614c, 617c and 619c, frequency conversion circuit 615c, local oscillation circuit 616c, IF amplifier circuit 618c, detection circuit 621c and AGC circuit 622c correspond to the reception antenna 611a, RF amplifier circuit 613a, filter circuits 614a, 617a and 619a, frequency conversion circuit 615a, local oscillation circuit 616a, IF amplifier circuit 618a, detection circuit 621a and AGC circuit 622a, respectively, which are shown in FIG. 2 of the first embodiment, and the detailed description thereof is omitted.

The noise detection circuit 625c compares the level of detection signal inputted from the detection circuit 621c with a predetermined reference level to determine whether a noise signal is mixed, and mixing frequency of the noise signal (degree of mixing), and, according to the determined result, generates a timing control signal tc for controlling generation of a noise removal control signal G3 by the timing generation circuit 623c. To be concrete, for example, larger difference between the level of detection signal and the predetermined reference level is determined to be higher mixing frequency of the noise signal.

The timing generation circuit 623c generates and outputs the noise removal control signal G3 for controlling noise removal from the reception signal received by the antenna 611c according to the timing control signal tc inputted from the noise detection circuit 625c. The noise removal control signal G3 is, as in the case of the noise removal control signal G1 of the first embodiment, a pulse signal having a constant pulse width W. The length of the pulse interval depends on the signal level of the timing control signal tc, and is set shorter as the mixing frequency of the noise signal detected by the noise detection circuit 625c is higher, and set longer as the mixing frequency is lower.

The SW control circuit 624c controls ON/OFF of the switch circuit 612c according to the noise removal control signal G3 inputted from the timing generation circuit 623c. To be concrete, the switch circuit 612c is turned ON while the noise removal control signal G3, a pulse signal, is being inputted, otherwise the switch circuit is turned OFF.

Accordingly, during the time corresponding to the pulse width W of the noise removal control signal G3, the antenna 611c is short-circuited, and the reception signal is not inputted to the RF amplifier circuit 613c. Since the pulse width W covers, for example, a few cycles of carrier wave of the reception signal received by the antenna 611c, the short circuit of the antenna 611c causes most of the energy accumulated in the antenna 611b at this time to be released.

<Operations and Effects>

According to the third embodiment, the switch circuit 612c is turned ON and OFF according to the noise removal control signal G3 generated at the timing generation circuit 623c. The noise removal control signal G3 is a pulse signal having a constant pulse width W and pulse intervals in accordance with the signal level of the timing control signal tc. That is, the reception antenna 611c is periodically short-circuited during the time corresponding to the pulse width W at time intervals corresponding to the pulse intervals of the control signal G3. This short circuit of the reception antenna 611c causes the accumulated energy to be released, thereby removing noise signals from the reception signal, and allowing removal of the continuation of influence caused by the accumulated energy of the noise signals. Further, since the noise removal signal G3 is a signal based on the comparison result between the signal level of the detection signal and the predetermined reference level, resultantly, the reception antenna 611c is short-circuited at time intervals corresponding to the mixing frequency of the noise signal, and thus noise signals and its influence can be removed more effectively.

<Modifications>

Application of the present invention is not limited to the embodiments described above, and various changes may be made without departing from the spirit of the invention.

(1) Controlling Generation of Noise Removal Control Signal Through CPU 10.

For example, the CPU 10 may control generation of the noise removal control signals G1, G2 and G3, instead of the timing generation circuits 623a, 623b and 623c. That is, the CPU 10 may determine whether a noise signal is mixed and mixing frequency based on a waveform of the detection signal, and may allow generation of the noise removal control signals G1, G2 or G3 when it is determined that a noise signal is mixed. To be concrete, as for the standard radio wave in Japan, for example, a pulse signal (second signal) having a pulse width of 0.2 sec, 0.5 sec or 0.8 sec is sent every one second. The CPU 10 checks existence of the leading edge of the second signal based on the detection signal, and enables generation of the noise removal control signals G1, G2 or G3, if the number of second signals in which the leading edge is not recognized within one frame (one minute) exceeds a predetermined number. Alternatively, according to a mixing degree of noise signals or the number of second signals in which the leading edge is not recognized, the pulse intervals (periods) of the noise removal control signals G1, G2 or G3 may be varied.

(2) Radio Wave Receiver of Straight System

Figure 8:
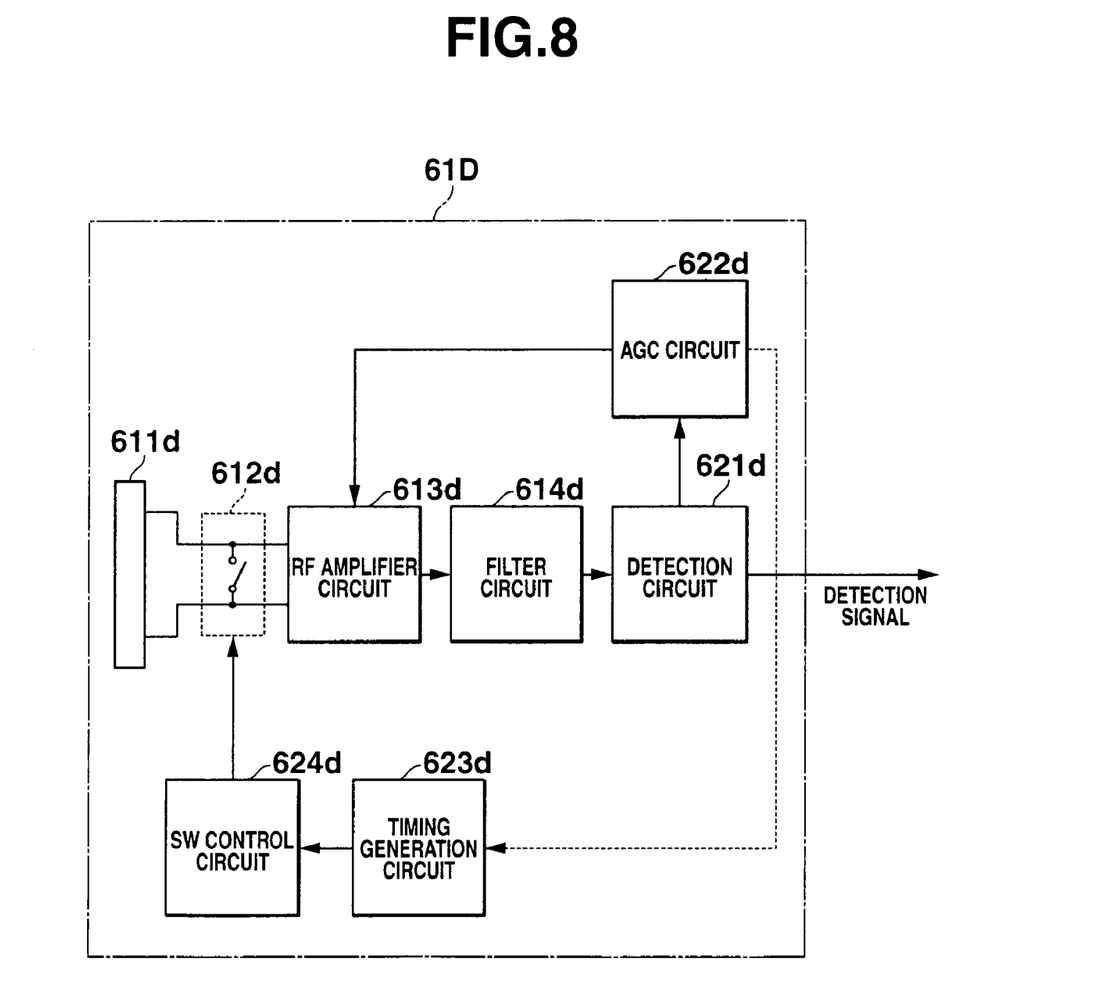
FIG. 8 is a diagram showing a circuit configuration of a radio wave receiver produced by applying the invention to a straight system.

Although the invention has been applied to the radio wave receiver 61 (61A, 61B and 61C) of the super-heterodyne system in the embodiments described above, the invention is also applicable to a radio wave receiver 61D of a straight system shown in FIG. 8.

FIG. 8 shows a circuit configuration of the radio wave receiver 61D of the straight system applied to the first and second embodiments. In FIG. 8, the same elements as those in the above-described receivers 61A (see FIG. 2), 61B (see FIG. 5) and 61C (see FIG. 7) are designated by the same reference numerals. Referring to FIG. 8, the radio wave receiver 61D includes a reception antenna 611d, a switch circuit 612d, an RF amplifier circuit 613d, a filter circuit 614d, a detection circuit 621d, an AGC circuit 622d, a timing generation circuit 623d and an SW control circuit 624d.

In this case, the detection circuit 621d receives a signal outputted from the filter circuit 614d, and the AGC circuit 622d generates an RF control signal for controlling amplification degree of the RF amplifier circuit 613d. Each of the configuration elements in the receiver 61D except the reception antenna 611d may be constituted using a semiconductor integrated circuit.

(3) Application to Repeater (Radio Wave Transmitting/Receiving Device)

Although descriptions have been given of the embodiments where the present invention is applied to a wave clock, the invention is also applicable to a repeater. The repeater is a device which is installed, for example, near the window of a building such as a steel framed house, where it is difficult for radio waves to penetrate, and receives the standard radio wave to obtain an accurate time information and transmits the time information. The wave clock installed inside a room receives the time information transmitted from the repeater to correct the time.

Figure 9:
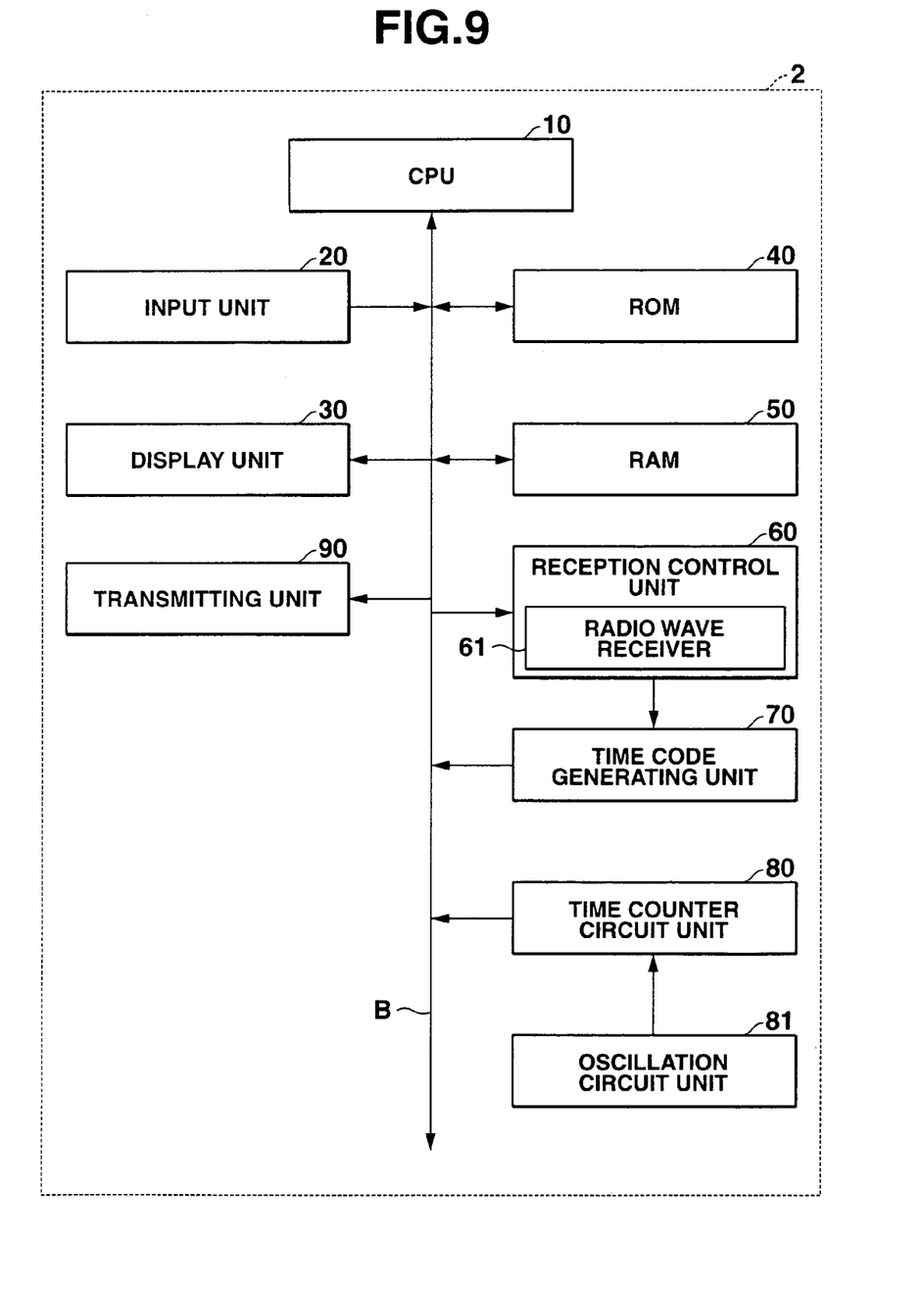
FIG. 9 is a diagram showing a circuit configuration of a repeater to which the present invention is applied.

FIG. 9 is a block diagram showing an internal structure of a repeater 2 to which the invention is applied. In the drawing, the same elements as those in the wave clock 1 (see FIG. 1) are designated by the same reference numerals. Referring to FIG. 9, the repeater 2 includes a CPU 10, an input unit 20, a display unit 30, a ROM 40, a RAM 50, a reception control unit 60, a time code generating unit 70, a time counter circuit unit 80, an oscillation circuit unit 81, and a transmitting unit 90.

The transmitting unit 90 generates a relaying time code based on the current time data counted by the time counter circuit unit 80, and sends through a transmitting antenna a relaying radio wave produced by adding the relaying time code to a carrier wave. The carrier wave may be the same as the receiving standard radio wave, or may be a dedicated radio wave as the relaying radio wave. When the carrier wave is the same as the standard radio wave, the wave clock placed inside a room or the like may be a normal wave clock. When the carrier wave is the dedicated radio wave as the relaying radio wave, a wave clock may need to have a section for receiving the dedicated radio wave.

According to the invention, an antenna is periodically short-circuited at predetermined intervals to release the accumulated energy due to a reception signal. Thus, even when the antenna receives a signal mixed with noise signals, the periodic short circuit at the antenna can release the accumulated energy due to the noise signals, thereby removing the noise signals from the reception signal, and also allowing removal of long lasting influence caused by the accumulated energy due to the noise signals.

Further, in the invention, the interval for short-circuiting the antenna is varied based on the signal level of an amplification degree adjustment signal for adjusting the amplification degree of the reception signal. Since the amplification degree adjustment signal is generated based on the detection signal level, the higher the detection signal level is, the larger the noise-mixed signal is regarded to be. Therefore, the interval for short-circuiting the antenna can be controlled, for example, by making the short circuit interval longer when the reception sensitivity is low in an intense electric field and the detection signal level is high, and shorter when the reception sensitivity is high in a weak electric field and the detection signal level is low.

In the invention, the mixing frequency of a noise signal into the reception signal is determined based on a signal waveform of the detection signal, and, when it is determined that noise is mixed, the antenna is short-circuited for a predetermined time to release the accumulated energy due to the reception signal. Thus, even when the antenna receives a signal mixed with noise signals, short circuit at the antenna can release the accumulated energy due to the noise signals, and thus the noise signals can be removed from the reception signal, and long lasting influence caused by the accumulated energy due to the noise signals can be also removed.

In this case, the mixing frequency of a noise into the reception signal is determined, and the antenna can be periodically short-circuited according to the determined mixing frequency. Thus, the short-circuited period of the antenna can be controlled, for example, to be made shorter for a higher mixing frequency of the noise signal, and longer for a lower mixing frequency.

According to the invention, the antenna can be short-circuited for a time of or more than a half cycle of the carrier wave of the reception signal and short in comparison with the cycle of the modulated signal. Since a tuning frequency of the antenna equals the carrier wave frequency of the reception signal, by short-circuiting the antenna for a time of or more than a half cycle of the carrier wave, most of the accumulated energy of the antenna due to the noise signals can be released.

What is claimed is:

1. A radio wave receiver to detect a reception signal received by an antenna and output a detection signal, comprising:
    an antenna short circuit control section to release accumulated energy due to the reception signal by periodically short-circuiting the antenna at predetermined time intervals;
    an amplifier section to amplify the reception signal;
    an amplification degree adjustment section to generate an amplification degree adjustment signal for adjusting an amplification degree in the amplifier section in accordance with a signal level of the detection signal; and
    a short circuit interval varying section to vary a short circuit interval of the antenna based on a signal level of the amplification degree adjustment signal generated by the amplification degree adjustment section.

2. The radio wave receiver as claimed in claim 1, wherein the antenna short circuit control section short-circuits the antenna for a time of at least a half cycle of a carrier wave of the reception signal, and shorter than a cycle of a modulated wave of the reception signal.

3. A radio wave receiver to detect a reception signal received by an antenna and output a detection signal, comprising:
    a noise mixing determining section to determine a mixing frequency of a noise signal mixed in the reception signal based on a signal waveform of the detection signal; and
    an antenna short circuit control section to release accumulated energy due to the reception signal by short-circuiting the antenna for a predetermined time at an interval corresponding to the mixing frequency determined by the noise mixing determining section.

4. The radio wave receiver as claimed in claim 3, wherein the antenna short circuit control section short-circuits the antenna for a time of at least a half cycle of a carrier wave of the reception signal, and shorter than a cycle of a modulated wave of the reception signal.

5. A wave clock comprising:
    a detection section to detect a reception signal received by an antenna;
    a time code generating section to generate a standard time code based on a detection signal outputted from the detection section;
    a time counting section to count current time data;
    a correcting section to correct the current time data counted by the time counting section, based on the standard time code generated by the time code generating section; and
    an antenna short circuit control section to release accumulated energy due to the reception signal by periodically short-circuiting the antenna at predetermined time intervals.

6. The wave clock as claimed in claim 5, further comprising:
    an amplifier section to amplify the reception signal;
    an amplification degree adjustment section to generate an amplification degree adjustment signal for adjusting an amplification degree in the amplifier section in accordance with a signal level of the detection signal; and
    a short circuit interval varying section to vary a short circuit interval of the antenna based on a signal level of the amplification degree adjustment signal generated by the amplification degree adjustment section.

7. The wave clock as claimed in claim 5, further comprising:
    an amplifier circuit to amplify the reception signal;
    an amplification degree adjustment circuit to generate an amplification degree adjustment signal for adjusting an amplification degree in the amplifier circuit in accordance with a signal level of the detection signal; and
    a short circuit interval varying circuit to vary a short circuit interval of the antenna based on a signal level of the amplification degree adjustment signal generated by the amplification degree adjustment circuit.

8. A repeater comprising:
    a detection section to detect a reception signal received by an antenna;
    a time code generating section to generate a standard time code based on a detection signal outputted from the detection section;
    a transmitting section to transmit the standard time code generated by the time code generating section; and
    an antenna short circuit control section to release accumulated energy due to the reception signal by periodically short-circuiting the antenna at predetermined time intervals;
    an amplifier section to amplify the reception signal;
    an amplification degree adjustment section to generate an amplification degree adjustment signal for adjusting an amplification degree in the amplifier section in accordance with a signal level of the detection signal; and
    a short circuit interval varying section to vary a short circuit interval of the antenna based on a signal level of the amplification degree adjustment signal generated by the amplification degree adjustment section.

9. The repeater as claimed in claim 8, wherein the amplifier section comprises an amplifier circuit.

10. A radio wave reception integrated circuit to detect a received reception signal and output a detection signal, comprising:
   an antenna short circuit control circuit to release accumulated energy due to the reception signal by periodically short-circuiting the antenna at predetermined time intervals;
   an amplifier circuit to amplify the reception signal;
   an amplification degree adjustment circuit to generate an amplification degree adjustment signal for adjusting an amplification degree in the amplifier circuit in accordance with a signal level of the detection signal; and
   a short circuit interval varying circuit to vary a short circuit interval of the antenna based on a signal level of the amplification degree adjustment signal generated by the amplification degree adjustment circuit.

11. The integrated circuit as claimed in claim 10, wherein the antenna short circuit control circuit short-circuits the antenna for a time of at least a half cycle of a carrier wave of the reception signal, and shorter than a cycle of a modulated wave of the reception signal.

12. A radio wave reception integrated circuit to detect a received reception signal and output a detection signal, comprising:
   a noise mixing determining section to determine a mixing frequency of a noise signal mixed in the reception signal based on a signal waveform of the detection signal; and
   an antenna short circuit control section to release accumulated energy due to the reception signal by short-circuiting the antenna for a predetermined time at an interval corresponding to the mixing frequency determined by the noise mixing determining section.

13. The integrated circuit as claimed in claim 12, wherein the antenna short circuit control circuit short-circuits the antenna for a time of at least a half cycle of a carrier wave of the reception signal, and shorter than a cycle of a modulated wave of the reception signal.

* * * * *